United States Patent
Kobayashi

(10) Patent No.: US 6,774,027 B2
(45) Date of Patent: Aug. 10, 2004

(54) SEMICONDUCTOR DEVICE AND METHOD FOR MANUFACTURING THE SAME

(75) Inventor: Kaname Kobayashi, Yamanashi (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/385,931

(22) Filed: Mar. 11, 2003

(65) Prior Publication Data

US 2003/0183933 A1 Oct. 2, 2003

Related U.S. Application Data

(62) Division of application No. 09/836,422, filed on Apr. 18, 2001, now Pat. No. 6,577,001.

(30) Foreign Application Priority Data

Apr. 19, 2000 (JP) ........................................ 2000-117993

(51) Int. Cl.$^7$ ............................................. H01L 21/44
(52) U.S. Cl. ...................... 438/612; 438/613; 438/614; 438/615; 438/617
(58) Field of Search ................................. 438/612–615, 438/617

(56) References Cited

U.S. PATENT DOCUMENTS

| | | | |
|---|---|---|---|
| 5,034,345 A | 7/1991 | Shirahata | 437/183 |
| 5,448,016 A | 9/1995 | DiPaolo | 174/126.1 |
| 5,587,337 A * | 12/1996 | Idaka et al. | 437/183 |
| 6,024,274 A | 2/2000 | Chang et al. | 228/180.22 |
| 6,049,130 A | 4/2000 | Hosomi et al. | 257/750 |
| 6,475,897 B1 * | 11/2002 | Hosaka | 438/617 |
| 2001/0040289 A1 * | 11/2001 | Kobayashi | 257/737 |

FOREIGN PATENT DOCUMENTS

JP 05251450 A 9/1993

* cited by examiner

Primary Examiner—Lynne Gurley
(74) Attorney, Agent, or Firm—Volentine Francos, PLLC

(57) ABSTRACT

A semiconductor device includes a semiconductor chip having a bump electrode over its main surface. The bump electrode has at least one protrusion on the top surface thereof. A lead is electrically connected to the top surface of the bump electrode, and is positioned adjacent to the protrusion.

3 Claims, 16 Drawing Sheets

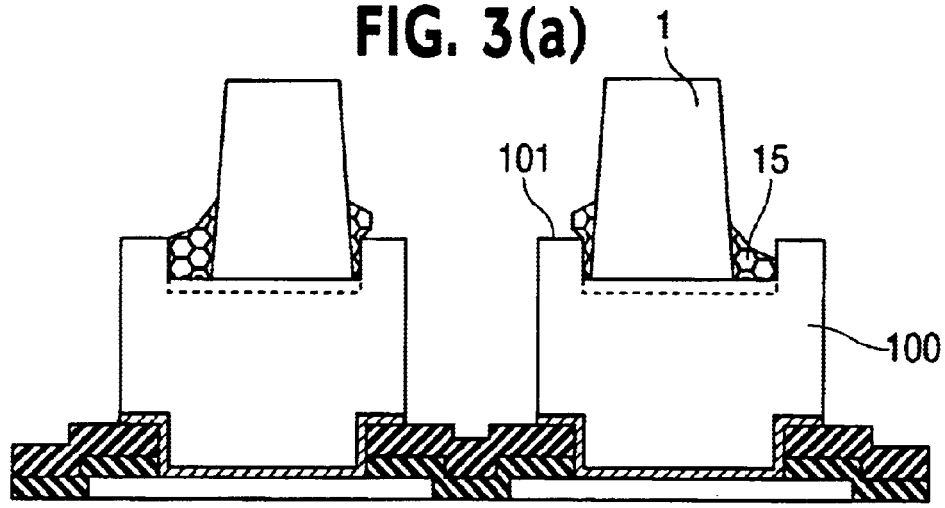
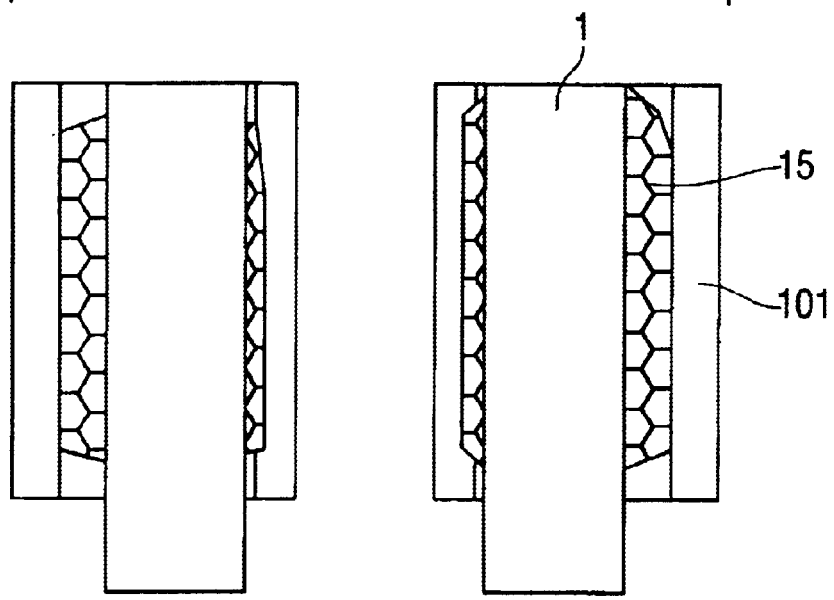

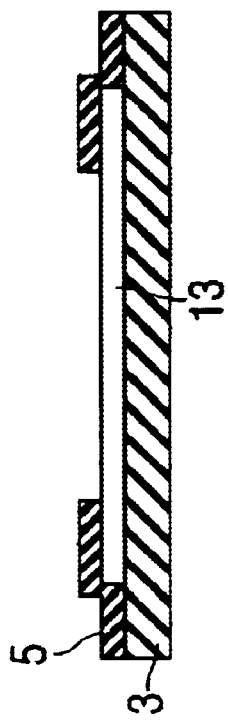
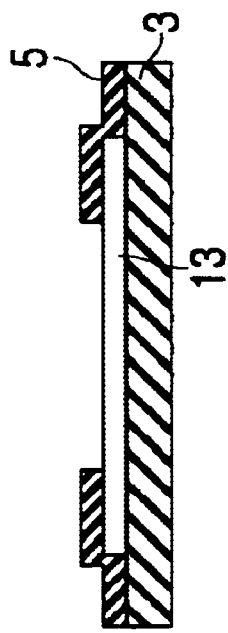
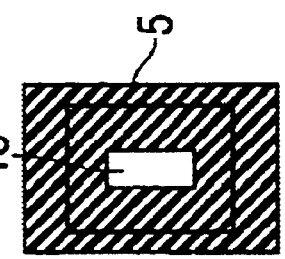

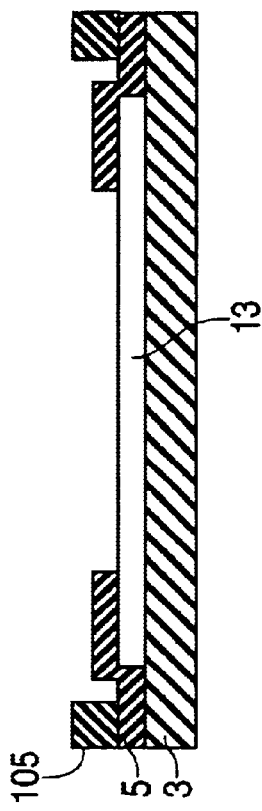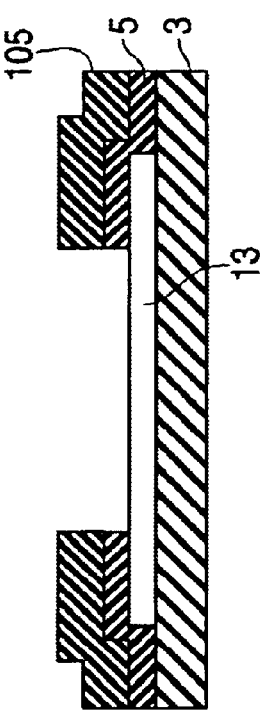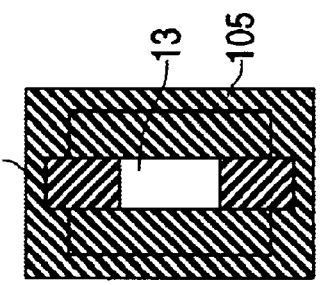

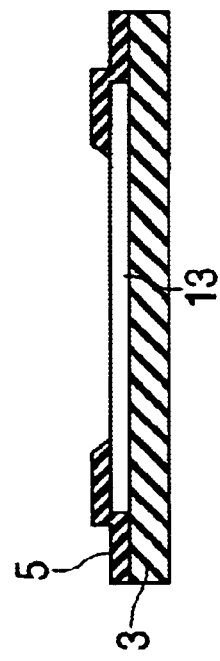
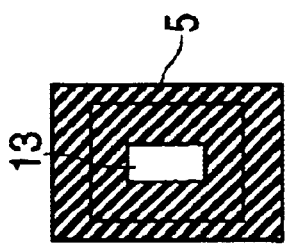
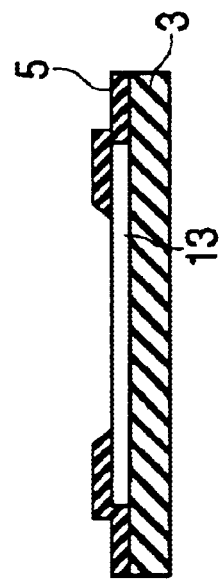

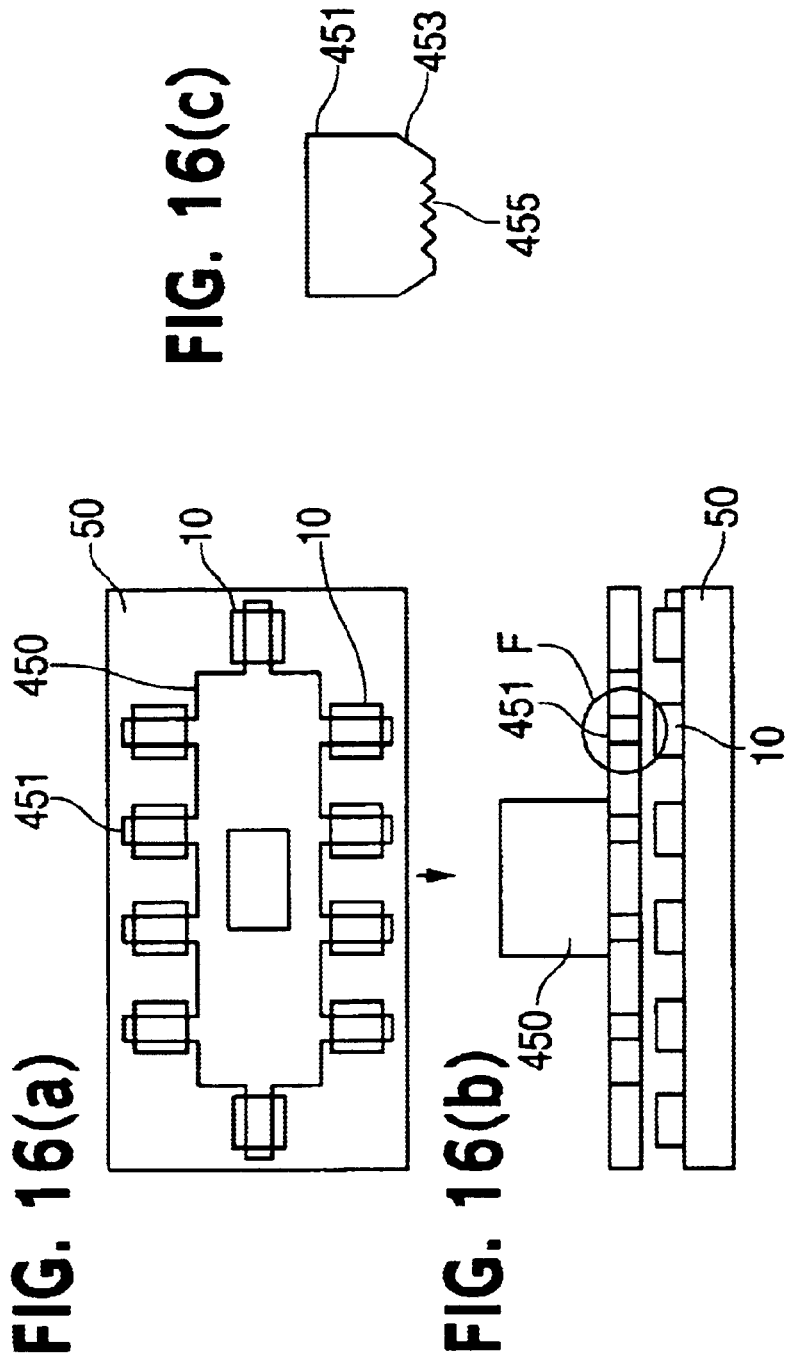

US 6,774,027 B2

SEMICONDUCTOR DEVICE AND METHOD FOR MANUFACTURING THE SAME

This is a continuation of application Ser. No. 09/836,422 filed Apr. 18, 2001 now U.S. Pat. No. 6,577, 001.

BACKGROUND OF THE INVENTION

1. Field of the Invention

The present invention relates to a semiconductor device, and to a method for manufacturing the same In particular, this invention relates to a Tape Carrier Package (TCP).

2. Description of the Related Art

FIG. 18 is an oblique perspective view of a connecting portion at an inner lead and a bump electrode of the conventional semiconductor device. A plurality of bump electrodes 10 are formed on a main surface of a semiconductor chip 50. Each bump electrode 10 is electrically connected to an inner circuit of the semiconductor chip 50. A plurality of bump electrodes 10 are aligned at a peripheral portion of the semiconductor chip 50. A metal layer 7 is formed under the bump electrodes 10. At the peripheral bottom portion of the bump electrodes, an insulating layer 5 for protecting the semiconductor chip 50 is formed below the metal layer 7. The bump electrodes have concave portions 10a at the central portions of the top surfaces thereof. Each bump electrode 10 is electrically connected to an inner lead 1 through a portion top 10b, which surrounds the concave potion 10a of the bump electrode 10. A conductive material (for example, solder, tin, gold etc. . . . ) is used to connect the inner lead 1 and the bump 10. Only one inner lead is shown in FIG. 18. However, inner leads are formed on each bump electrode.

FIG. 19 shows a cross sectional view of the bump electrode 10. The insulating layer 5 is formed over the semiconductor chip (not shown), and surrounds the bump electrodes. The metal layer 7 is formed on a pad electrode 13. The metal layer 7 is also formed on the insulating layer 5, which is formed on the peripheral portion of the pad electrode 13. The bump electrode 10 is formed on the metal layer 7. The inner lead 1 is electrically connected to the bump electrodes 10 at the top surface of the bump electrode using the conductive material.

The smaller the chip size becomes, the narrower the distance between inner leads becomes. The distance between inner leads is presently about 45–50 μm, and the distance between bump electrodes is presently about 15–20 μm. Therefore, the problems described with reference to the cross sectional views of FIG. 20(a)–20(c) are sometimes encountered. These problems result in a short circuit on the semiconductor chip 50.

A first problem is a bending of the inner lead during an inner lead bonding, which is used to connect the inner leads 1 and bump electrodes 10. If an inner lead bends, the bent inner lead may electrically connect to an adjacent inner lead, or to an adjacent bump electrode as shown in FIG. 20(a). Alternately, two bent inner leads 1 may contact each other across a gap between adjacent bump electrodes 10 as shown in FIG. 20(b).

Another problem is the protrusion of the conductive material 15. The protrusions of adjacent conductive materials 15 touch each other and connected as shown in FIG. 20(c).

These problems are partially the result of the width of the inner lead being smaller than the thickness of the inner lead. Therefore, the inner lead 1 is easily bent in a horizontal direction because its width is only about 10–20 μm. Also, the inner lead 1 is connected on the peripheral portion 10b of the top surface of the bump electrode 10, and is therefore easily bent in a horizontal direction. Further, the conductive material 15 tends to protrude because of the weight of the bonding tool used during inner lead bonding, and because of the melted state of the conductive material 15 prior to hardening.

A different structure of lead, which is called pin type lead, is disclosed in the application of Japanese laid open number HEI 5-251450. This technique places a pin-type lead in the concave portion 10a of the bump electrode 10. However, a special lead called a pin type lead, and therefore a number of processes such as bonding of inner leads, transforming have to be redesigned and changed. Further, the process for manufacturing the semiconductor device becomes more complex and costly.

SUMMARY OF THE INVENTION

An object of the present invention is to provide a semiconductor device and the method for manufacturing the same. A semiconductor device includes a semiconductor chip having a main surface, a bump electrode having the bottom surface over main surface of the semiconductor chip. The bump electrode further havs a top surface opposite the bottom surface and a first protrusion extending upwardly from the top surface. The semiconductor device has a lead electrically connected to the bump electrode, and the lead has a bottom surface which faces towards the top surface of the bump electrode and which is located below a top of the first protrusion.

A method for manufacturing a semiconductor device includes forming a pad electrode over a main surface of a semiconductor chip, sequentially forming a first insulating layer and a second insulating layer over a peripheral region of the pad electrode, and a non-peripheral region of the pad electrode remains exposed. The method for manufacturing a semiconductor device further includes forming a metal layer over at least portions of the non-peripheral region of the pad electrode and the second insulating, forming a bump electrode on the metal layer.

BREIF DESCRIPTION OF THE DRAWINGS

While the specification concludes with claims particularly pointing out and distinctly claiming the subject matter that is regarded as the invention, the invention, along with the objects, features, and advantages thereof, will be better understood from the following description taken FIG. 1 is an oblique perspective view of a semiconductor device according to a first embodiment of the present invention.

FIG. 2(a) and FIG. 2(b) are cross sectional views of the bump electrode 100 of the semiconductor device of the first embodiment. In particular, FIG. 2(a) is a cross sectional in an X-Y plane shown in FIG. 1, and FIG. 2(b) is a cross sectional view in a Y-Z plane shown in FIG. 1.

FIG. 3(a) is a cross sectional view in the X-Y plane for describing an effect of the first embodiment, and FIG. 3(b) is a top view in an X-Z plane for describing an effect of the first embodiment.

FIG. 4(a) is a cross sectional view in the X-Y plane of a portion of FIG. 1. FIG. 4(b) is a top view of FIG. 4(a), and FIG. 4(c) is a cross sectional view in the Y-Z plane of a portion of FIG. 1.

Figure 1:
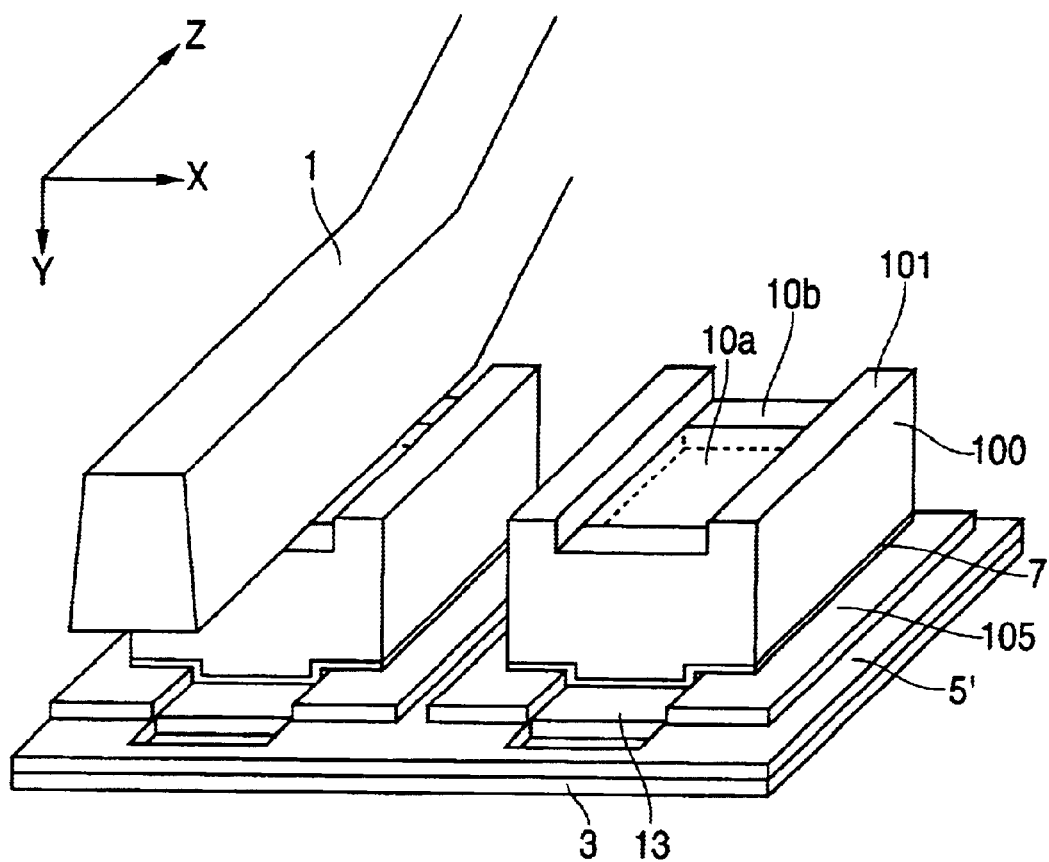

FIG. 5(a) is a cross sectional view in the X-Y plane of a portion of FIG. 1. FIG. 5(b) is a top view of FIG. 5(a). FIG. 5(c) is a cross sectional view in the Y-Z plane of a portion of FIG. 1.

Figure 6A:
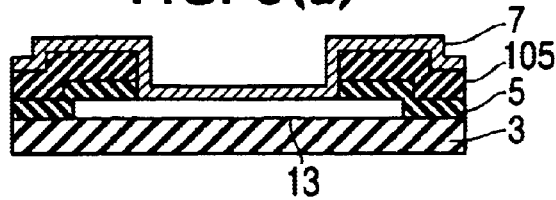
Figure 6B:
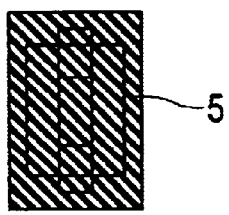

FIG. 6(a) is a cross sectional view in the X-Y plane of a portion of FIG. 1, and FIG. 6(b) is a top view of FIG. 6(a).

Figure 7A:
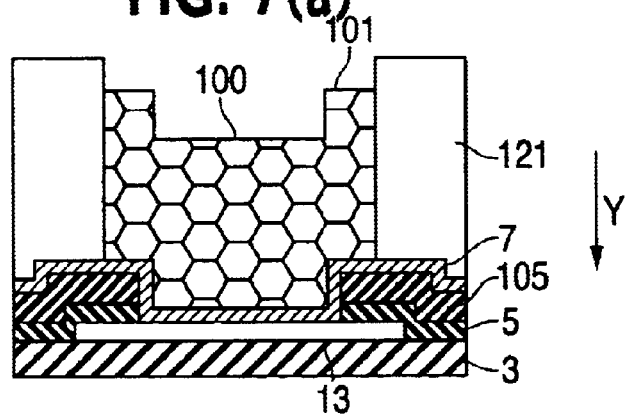
Figure 7B:
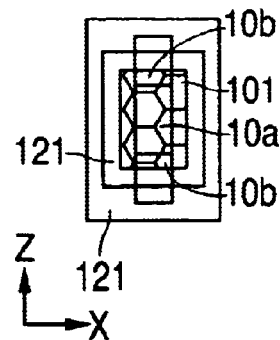

FIG. 7(a) is a cross sectional view in the X-Y plane of a portion of FIG. 1, and FIG. 7(b) is a top view of FIG. 7(a).

Figure 8:
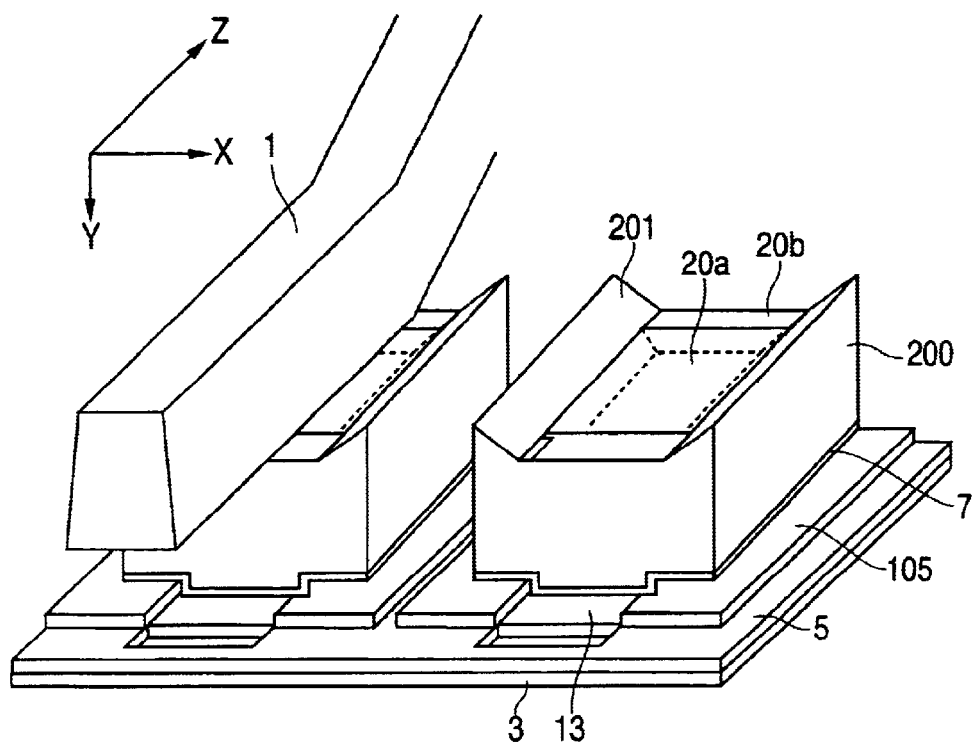

FIG. 8 is an oblique perspective view of the semiconductor device according to a second embodiment of the present invention.

Figure 9B:
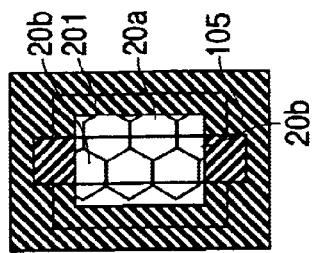
Figure 9A:
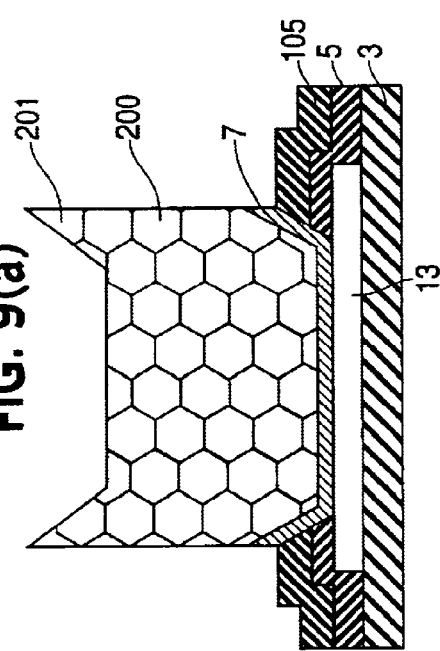
Figure 9C:
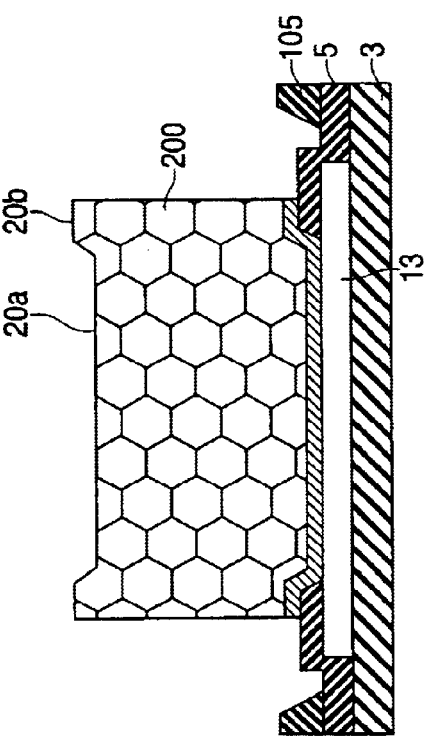

FIGS. 9(a) and 9(c) are cross sectional views of the bump electrode 200 of the semiconductor device of the second embodiment. In particular, FIG. 9(a) is a cross sectional view in an X-Y plane shown in FIG. 8, FIG. 9(b) is a top view of FIG. 9(a), and FIG. 9(c) is a cross sectional view in a Y-Z plane shown in FIG. 8.

Figure 10:
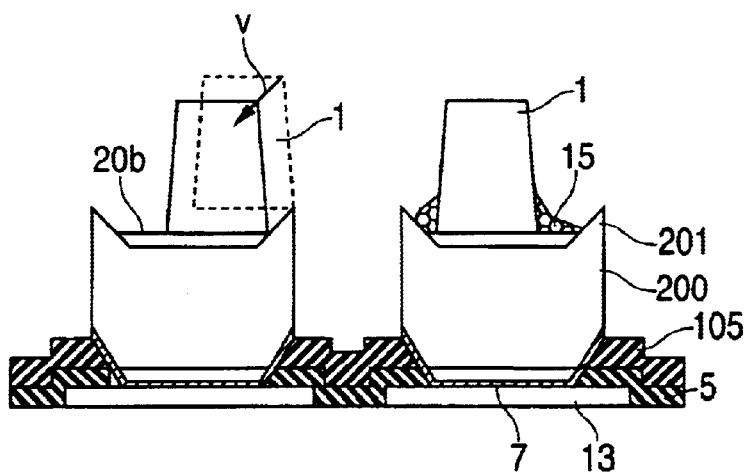

FIG. 10 is a cross sectional view in an X-Y plane shown in FIG. 8

FIG. 11(a) is a cross sectional view in the X-Y plane of a portion of FIG. 8. FIG. 11(b) is a top view of FIG. 11(a), and FIG. 11(c) is a cross sectional view in the Y-Z plane of a portion of FIG. 8.

Figure 12C:
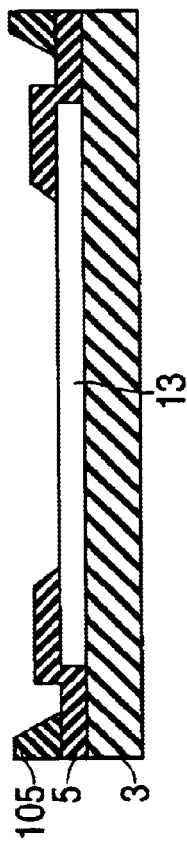
Figure 12A:
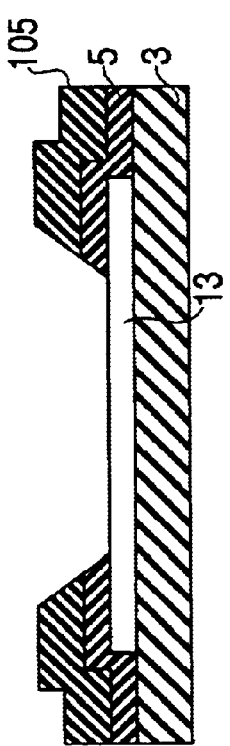
Figure 12B:
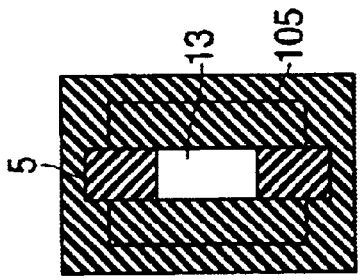

FIG. 12(a) is a cross sectional view in the X-Y plane of a portion of FIG. 8. FIG. 12(b) is a top view of FIG. 12(a), and FIG. 12(c) is a cross sectional view in the Y-Z plane of a portion of FIG. 8.

Figure 13A:
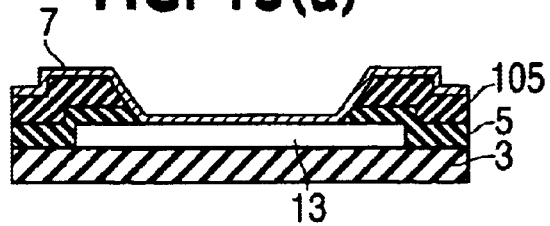
Figure 13B:
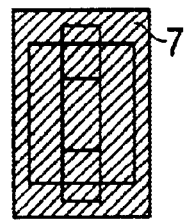

FIG. 13(a) is a cross sectional view in the X-Y plane of a portion of FIG. 8. FIG. 13(b) is a top view of FIG. 13(a).

Figure 14A:
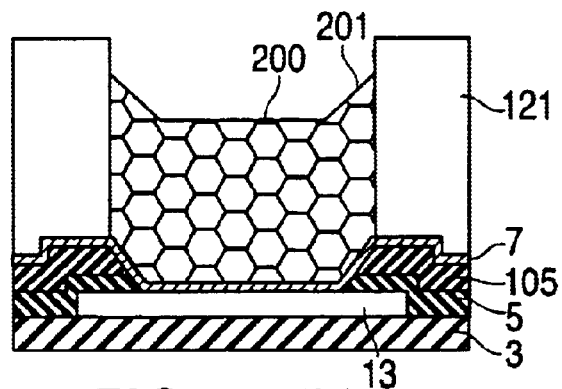
Figure 14B:
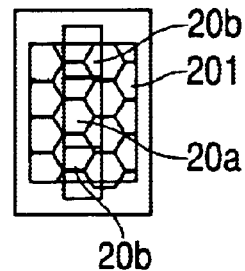

FIG. 14(a) is a cross sectional view in the X-Y plane of a portion of FIG. 8. FIG. 14(b) is a top view of FIG. 14(a).

Figure 15A:
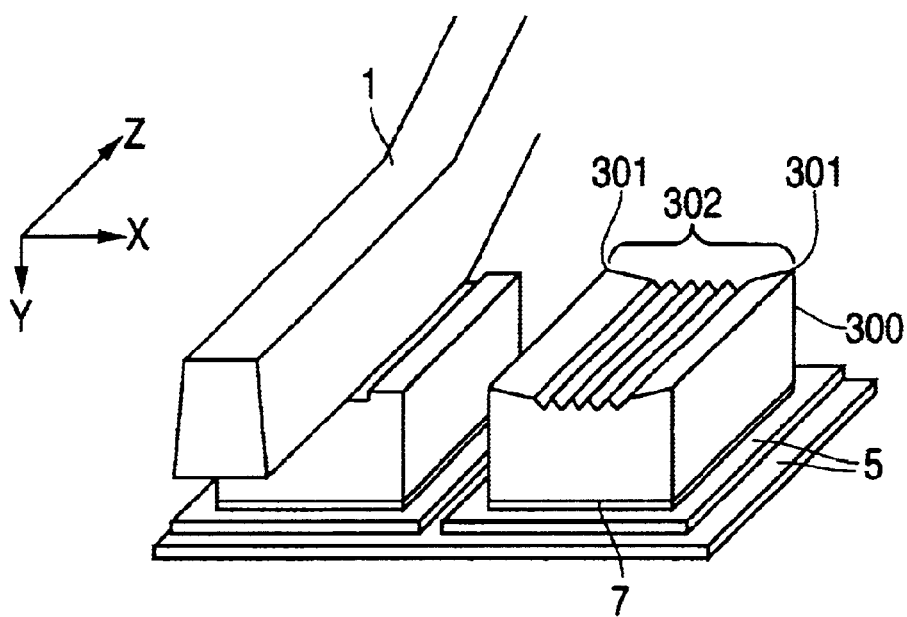
Figure 15B:
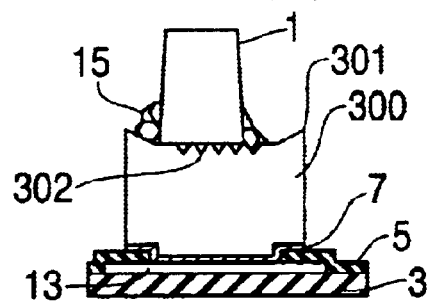

FIG. 15(a) is an oblique perspective view of the semiconductor device according to a third embodiment of the present invention. FIG. 15(b) is a cross sectional view in the X-Y plane of a portion of FIG. 15(a).

FIG. 16 shows a tool to shape the bump electrode. FIG. 16(a) is a top view of the tool, and FIG. 16(b) is a side view of the tool. FIG. 16(c) is an enlarged view of the portion that is shown in circle F of FIG. 16(b).

Figure 17A:
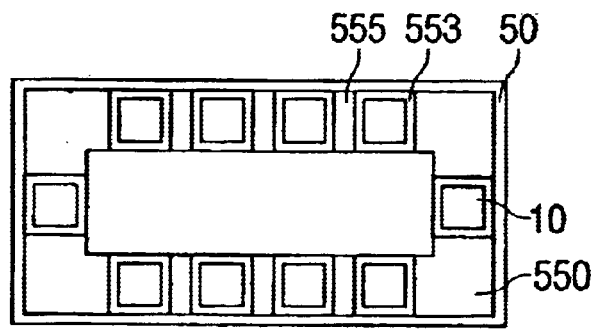
Figure 17B:
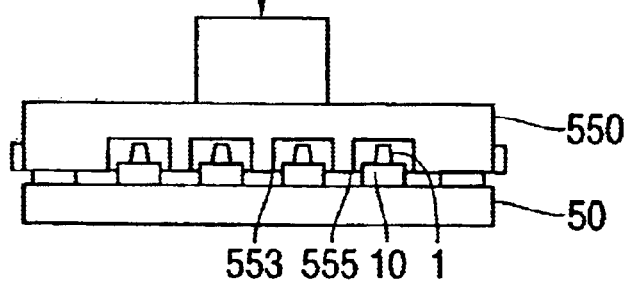

FIG. 17(a) is a top view of the bonding tool 550 of this embodiment. FIG. 17(b) is a side view of the bonding tool 550 of this embodiment.

Figure 18:
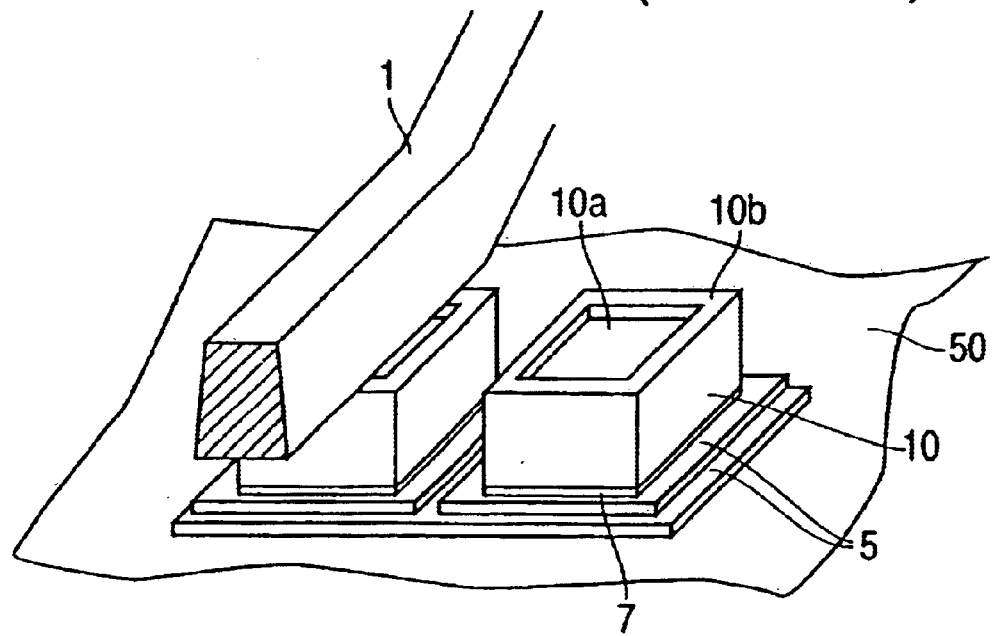

FIG. 18 is a perspective view of a connecting portion between an inner lead and a bump electrode in the conventional semiconductor device.

Figure 19:
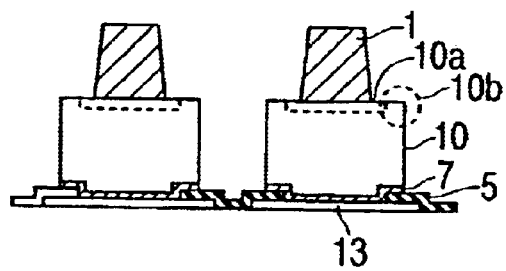

FIG. 19 is a cross sectional view of the bump electrode 10 of the conventional semiconductor device.

Figure 20A:
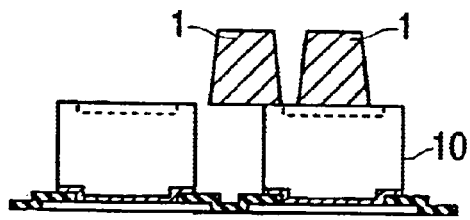
Figure 20B:
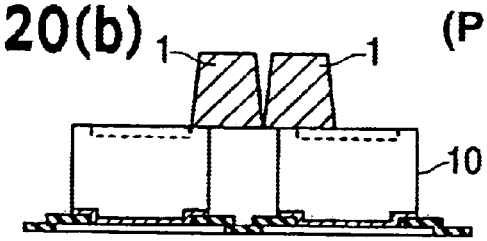
Figure 20C:
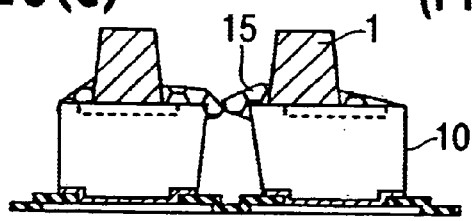

FIGS. 20(a)–20(c) are cross sectional views of the conventional semiconductor device configurations.

DETAILED DESCRIPTION OF THE PREFERRED EMBODIMENT

FIG. 1 is an oblique perspective view of the semiconductor device of the first embodiment. The same reference numbers are used in FIG. 1 to denote the same elements as shown in FIG. 18. The bump electrodes 100, which are made of Au or Cu, etc., have concave portions 10a at the central portions of top surfaces thereof. The each concave portion 10a is surrounded by a peripheral portion 10b. The bump electrodes further have a protrusion 101 in this embodiment. The protrusion 101 is higher than the peripheral portion 10b, where an inner lead is placed. The protrusion 101 extends a direction Z parallel to the inner lead. The protrusion 101 is formed adjacent to the space in which the inner lead 1 is laid in a horizontal direction X.

A metal layer 7 is formed under the bump electrode 100. This metal layer includes a titanium layer, a platinum layer, a nickel layer, a chromium layer, and a palladium layer.

Figure 2A:
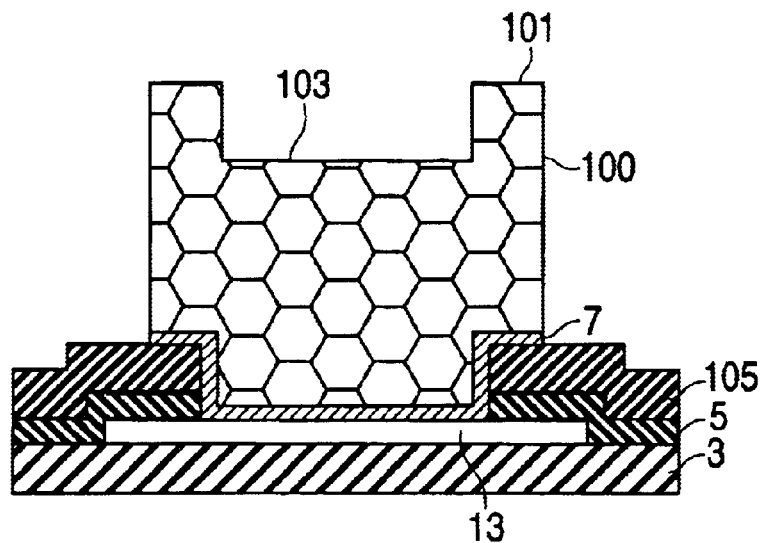

An insulating layer 105 is partly formed under the metal layer 7. The insulating layer 105 is formed under the peripheral portion 10b, and located at the portion corresponding to the protrusion 101. An insulating layer 5 for protecting the semiconductor chip is formed under the insulating layer 105 and the peripheral portion of the bump electrode. A pad electrode 13 shown in FIG. 2(a) is formed on an insulating layer 3 that is formed on a semiconductor chip 50. A peripheral portion of the pad electrode is covered with the insulating layer 5. The pad electrode 13 is electrically connected to an inner circuit of the semiconductor chip 50 via a through-hole formed in the insulating layer 3. The pad electrode 13 is made of aluminum as an example.

Figure 2B:
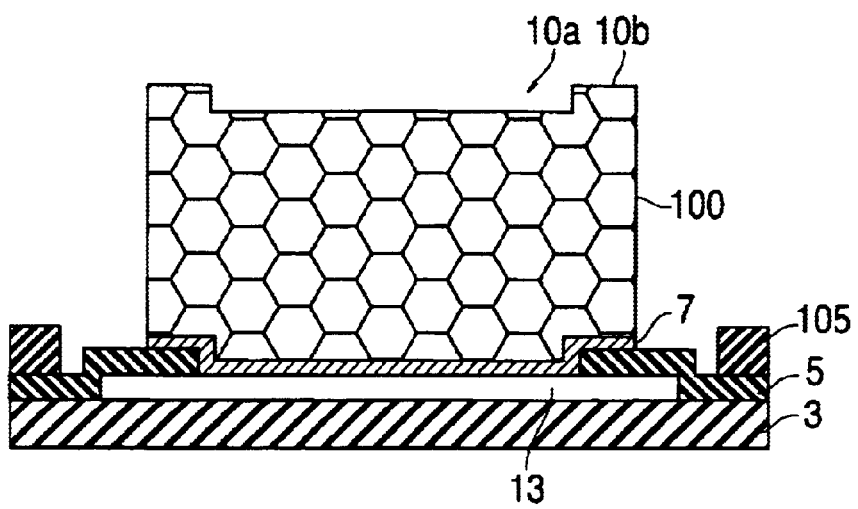

FIG. 2(a) and FIG. 2(b) are cross sectional views of the bump electrode 100 of the semiconductor device of the first embodiment. In particular, FIG. 2(a) is a cross sectional in an X-Y plane shown in FIG. 1, and FIG. 2(b) is a cross sectional view in a Y-Z plane shown in FIG. 1. A pad electrode 13 is formed on an insulating layer 3 as shown in FIG. 2(a) and FIG. 2(b). The pad electrode 13 is electrically connected to an inner circuit of the semiconductor chip via through-hole formed in the insulating layer 3. The through-hole is not shown in FIG. 2. A peripheral portion of the pad electrode 13 is covered with the insulating layer 5. The insulating layer 5 is extended to the portion on the insulating layer 3 from the portion on the pad electrode 13.

The insulating layer 105 is formed on the insulating layer 5 as shown in FIG. 2(a). The insulating layer 105 is formed at the portion corresponding to the protrusion 101, and under the bump electrode 100. The insulating layer 105 is not formed at the portion not corresponding to the protrusion 101, as shown in FIG. 2(b).

Both of the insulating layer 5 and the insulating layer 105 are formed over of the pad electrode 13. The portions, where both layers are formed, correspond to the protrusion 101. The insulating layer 5 is formed on other peripheral portions of the pad electrode 13. These insulating layers are not formed on the central portion of the pad electrode 13.

The metal layer 7 is formed on the central portion of the pad electrode 13, and formed on the insulating layer 5 formed on the peripheral portion of the pad electrode 13, and also formed on the insulating layer 105 formed over the peripheral portion of the pad electrode 13. The bump electrode 100 is formed on the metal layer 7.

The insulating layer 105 creates the difference in height over the peripheral portion of the pad electrode 13. Therefore, the bump electrode has the protrusion 101 on its top surface in addition to the concave portion 20a. As described below, the protrusion protects against short-circuits between inner leads.

FIG. 3(a) is a cross sectional view in the X-Y plane for describing an effect of the first embodiment, and FIG. 3(b) is a top view in an X-Z plane for describing an effect of the first embodiment. The inner leads 1 are connected to the bump electrodes 100 in both drawings. The protrusion 101 is formed adjacent to the inner lead 1 as shown in FIG. 3(a) and FIG. 3(b). The protrusion 101 prevents each inner lead from bending toward an adjacent inner lead. The conductive material 15, such as solder, tin, gold, expands in a direction parallel to the inner lead 1 because of the protrusion 101. The protrusion 101 prevents the conductive material 15 from protruding towards the adjacent bump electrode 100. It is expected that the adhesion to the bump electrodes 100 of the inner lead 1 is improved. It is possible to shorten the distance between each the bump electrodes 100.

The bump electrode 100 of the semiconductor device in this embodiment prevents a short-circuit between inner leads or bump electrodes, which is caused during a bonding of the inner leads.

Two protrusions 101 are formed on each bump electrode 100 in FIG. 1–FIG. 3. The inner leads are disposed between the protrusions. If there are bump electrodes on both sides of one bump electrode, this structure has an effect described above, toward the both sides of the bump electrode. In case that there is bump electrodes adjacent to one bump electrode (for example, the bump electrode nearest to the corner of the semiconductor chip), one protrusion, which is formed on the side of adjacent bump electrode, is enough to achieve the effect of this embodiment.

The method for manufacturing the semiconductor device of the first embodiment is described below. FIG. 4–FIG. 7 shows a method for manufacturing the semiconductor device of the first embodiment FIG. 4(a) is a cross sectional view in the X-Y plane of a portion of FIG. 1. FIG. 4(b) is a top view of FIG. 4(a), and FIG. 4(c) is a cross sectional view in the Y-Z plane of a portion of FIG. 1. FIG. 5(a) is a cross sectional view in the X-Y plane of a portion of FIG. 1. FIG. 5(b) is a top view of FIG. 5(a). FIG. 5(c) is a cross sectional view in the Y-Z plane of a portion of FIG. 1. FIG. 6(a) is a cross sectional view in the X-Y plane of a portion of FIG. 1, and FIG. 6(b) is a top view of FIG. 6(a). FIG. 7(a) is a cross sectional view in the X-Y plane of a portion of FIG. 1, and FIG. 7(b) is a top view of FIG. 7(a).

An insulating layer 3 is formed on a semiconductor chip 50. A pad electrode 13 is formed on the insulating layer 3 as shown in FIG. 4. An insulating layer 5 is formed over the whole surface of the semiconductor chip 50. The insulting layer 5 covers the whole surface of the pad electrode 13 at first, then a hole to expose a central portion of the pad electrode 13 is formed in the insulating layer 5. The hole is smaller than the pad electrode 13, and formed using lithography and etching techniques. The insulating layer 5 covers the peripheral portion of the pad electrode 13, and the central portion of the pad electrode is exposed as shown in FIG. 4(b).

An insulating layer 105, which is thicker than the insulating layer 5, is formed on the insulating layer 5 as shown in FIG. 5. Any materials can be chosen as the insulating layer 105. If the insulating layer 105 is the same material as the insulating layer 5, it has advantages that the adhesion between the insulating layer 5 and the insulating layer 105 is tight and the formation of the insulating layer 105 is performed under the same condition for forming the insulating layer 5. If the insulating layer 105 is a different material from the material of insulating layer 5, the insulating layer 105 is selectively etched and the insulating layer 5 on the peripheral portion of the pad electrode 13 properly remains during the etching of the insulating layer 105. The thickness of the insulating layer 105 is determined according to the thickness of the protrusion 101. The thickness of the insulating layer 105 is approximately the same as the protrusion 101.

The insulting layer 105 covers the whole surface of the pad electrode 13 and the insulating layer 5 at first, and then a hole is formed in the insulating layer 105. The hole exposes a central portion of the pad electrode 13 and the insulating layer 5 except for the portion corresponding to the protrusion 101. The hole has the same width as the hole formed in the insulating layer 5 along the direction X in FIG. 1 as shown in FIG. 5(a). The length of the hole along the direction Z in FIG. 1 is the same as the length of the pad electrode 13, or larger than the length of the pad electrode 13 as shown in FIG. 5(c). This hole is formed using lithography and etching techniques. The insulating layer 105 is partly formed over the peripheral portion of the pad electrode 13. The central portion of the pad electrode 13 is exposed, and the insulating layer 5 on the peripheral portion of the pad electrode 13 is partly exposed as shown in FIG. 5(b). Therefore, there are two kinds of thicknesses of the insulating layer on the peripheral portion of the pad electrode 13. The thickness of the insulating layer on the pad electrode 13 depends on whether the portion corresponds to the protrusion 101.

A metal layer 7 is formed on the pad electrode 13, the insulating layer 5, and the insulating layer 105 as shown in FIG. 6. The metal layer is formed by a sputtering, for example, and the metal layer has a plurality of layers as described above.

A photosensitive resin 121 is formed on the metal layer 7. Then a hole is formed in the photosensitive resin 121. This hole is located at the portion where the bump electrode 100 is formed. The size of the hole along the direction X and Z in FIG. 1 is larger than the hole formed in the insulating layer 5 and smaller than the pad electrode 13 as shown in FIG. 7(b). The central portion of the pad electrode 13 is exposed, and the insulating layer 5 and 105 on the peripheral portion of the pad electrode 13 is exposed.

The bump electrode 100 is formed in the hole as shown in FIG. 7. The bump electrode is formed by a electroplating. The metal layer 7 is used as a common electrode in the electroplating. The bump electrode has a concave portion 10a on its top surface. Configuration of the concave portion depends on the difference of the height between the pad electrode 13 and the insulating layer 5. The bump electrode further has a protrusion 101 on its top surface. Configuration of the protrusion 101 depends on the difference of the height between the pad electrode 13 and the insulating layer 105.

The photosensitive resin 121 is melted and removed using an acetone. The metal layer 7 except for the portion located under the bump electrode 100 is removed by etching. The bump electrode 100 is electrically separated from other bump electrodes in this process.

The bump electrode 100 which has a structure shown in FIG. 1 is formed as a result of the insulating layer 105 in this embodiment. The insulating layer 105 has a hole as described above. Therefore, the difference in thickness of the insulating layer makes the protrusion 101 on the top surface of the bump electrode 100. The process for manufacturing the bump electrode 100 is relatively simple and therefore avoids the increased costs for manufacturing.

FIG. 8 is an oblique perspective view of the semiconductor device of the second embodiment. The same reference numbers are applied in FIG. 8 as are shown in FIG. 1.

In this embodiment, the shape of the protrusion 201 on the top surface of the bump electrode 200 is different from the shape of the protrusion 101 of the first embodiment. The protrusion 201 has an inclination on its side surface. The inclination faces a central portion of the bump electrode. The concave portion 20a of FIG. 8 corresponds to the concave portion 10a of FIG. 1. The peripheral portion 20b of FIG. 8 corresponds to the peripheral portion 10b of FIG. 1. The structure except for above mentioned elements is the same as the first embodiment. FIGS. 9(a) and 9(c) are cross sectional views of the bump electrode 200 of the semiconductor device of the second embodiment. In particular, FIG. 9(a) is a cross sectional view in an X-Y plane shown in FIG. 8, FIG. 9(b) is a top view of FIG. 9(a), and FIG. 9(c) is a cross sectional view in a Y-Z plane shown in FIG. 8.

The side surface of the concave portion 20a is inclined as shown in FIG. 9(c). The side surface of the protrusion 201 is also inclined as shown in FIG. 9(a). An apex of the protrusion 201 is higher than the top surface of the peripheral portion 20b. The bump electrode 200 of the second embodiment has the same effect as the first embodiment because of the protrusion 201. The bump electrode 200 of the second embodiment has a further advantage that is described below.

FIG. 10 is a cross sectional view in an X-Y plane shown in FIG. 8. The inner lead 1 is aligned onto a predetermined portion 20b by itself when the inner lead 1 is pressed from an upper side in FIG. 10. This is because the inner lead 1 moves along the inclination of the protrusion 201. Even if the inner lead 1 is bent as shown by a dotted line in FIG. 10, the inner lead 1 is fixed on a proper position after the bonding as shown in FIG. 10. The bump electrode 200 of the embodiment remodels the bending of the inner lead 1. The bump electrode of the semiconductor device in the embodiment prevents a short-circuit between inner leads more certainly than that of the first embodiment.

The method for manufacturing the semiconductor device of the second embodiment is described below. FIG. 11–FIG. 14 show a method for manufacturing the semiconductor device of the second embodiment. FIG. 11(a) is a cross sectional view in the X-Y plane of a portion of FIG. 8. FIG. 11(b) is a top view of FIG. 11(a), and FIG. 11(c) is a cross sectional view in the Y-Z plane of a portion of FIG. 8. FIG. 12(a) is a cross sectional view in the X-Y plane of a portion of FIG. 8. FIG. 12(b) is a top view of FIG. 12(a), and FIG. 12(c) is a cross sectional view in the Y-Z plane of a portion of FIG. 8. FIG. 13(a) is a cross sectional view in the X-Y plane of a portion of FIG. 8. FIG. 13(b) is a top view of FIG. 13(a). FIG. 14(a) is a cross sectional view in the X-Y plane of a portion of FIG. 8. FIG. 14(b) is a top view of FIG. 14(a). FIG. 11–FIG. 14 correspond to FIG. 4–FIG. 7, respectively. Therefore, the steps not described below are the same as the steps of the first embodiment.

A pad electrode 13 is formed on the insulating layer 3 as shown in FIG. 11. An insulating layer 5 is formed over the whole surface of the semiconductor chip. The insulting layer 5 covers the pad electrode 13 at first, and then a hole to expose a central portion of the pad electrode 13 is formed in the insulating layer 5. The hole is smaller than the pad electrode, and is formed using lithography and etching techniques. The etching is performed to make a inclination at the side surface of the insulating layer 5 as shown in FIG. 11(a) and FIG. 11(c). The insulating layer 5 covers the peripheral portion of the pad electrode 13, and the central portion of the pad electrode is exposed as shown in FIG. 11(b).

An insulating layer 105, which is thicker than the insulating layer 5, is formed on the insulating layer 5 as shown in FIG. 12. The insulting layer 105 covers the pad electrode 13 and the insulating layer 5 at first, and then a hole is formed in the insulating layer 105. The hole exposes a central portion of the pad electrode 13 and the insulating layer 5 except for the portion corresponding to the protrusion 101. The hole has the same width as the hole formed in the insulating layer 5 along the direction X (FIG. 8) as shown in FIG. 12(a). The length of the hole along the direction Z (FIG. 8) is the same as the length of the pad electrode 13, or larger than the length of the pad electrode 13 as shown in FIG. 12(c). This hole is formed using lithography and etching techniques. The etching is performed to make a inclination at the side surface of the insulating layer 105 as shown in FIG. 12(a) and FIG. 12(c).

The insulating layer 105 is partly formed over the peripheral portion of the pad electrode 13. The central portion of the pad electrode 13 is exposed, and the insulating layer 5 on the peripheral portion of the pad electrode 13 is partly exposed as shown in FIG. 12(b).

A metal layer 7 is formed on the pad electrode 13, the insulating layer 5, and the insulating layer 105 as shown in FIGS. 13(a) and 13(b).

Subsequent steps, such a formation of photosensitive resin 121, a formation of a hole in the photosensitive resin 121, and formation of the bump electrode 200, are the same as the first embodiment. The photosensitive resin 121 is melted and removed using an acetone. The metal layer 7 except for the portion located under the bump electrode 200 is removed by etching. The bump electrode 200 is electrically separated from other bump electrodes after this process. The bump electrode 200 which has a structure shown in FIG. 8 is formed as a result of the insulating layer 105 in this embodiment. The insulating layer 105 has an inclination described above. Therefore, the protrusion 201 also has an inclination. The difference is a condition of etching. The process for manufacturing the bump electrode 200 is also respectively simple in this embodiment, and it has the same advantages of the first embodiment.

The insulating layer 5 has an inclination on its side surface as shown in FIG. 11. The inclination of the protrusion 201 depends on the insulating layer 105. Therefore, the advantage of the second embodiment is obtained in the insulating layer 5 which has a vertical side surface such as in FIG. 4. However, the same condition of etching as the etching of the insulating layer 105 is applied in the embodiment. It is expected that the protrusion of the conductive material 15 is further prevented because of the inclination of the side surface of the peripheral portion 20b.

FIG. 15(a) is an oblique perspective view of the semiconductor device of the third embodiment. FIG. 15(b) is a cross sectional view of the semiconductor device of the third embodiment. The same reference numbers are used to denote like elements in FIGS. 15(a) and 15(b)

As shown below, the third embodiment does not rely on the stepped configuration of underlying insulating layers to form the protrusions at top of the bump electrodes. Rather a specially designed tool is employed to configure the top surfaces of the bump electrodes.

The insulating layer 105 (FIG. 8) is not formed under the bump electrode 300 as shown in FIGS. 15(a) and 15(b). The bump electrode 300 has protrusions 301, which have an inclination as the second embodiment, and an uneven top surface between the protrusions 301. The uneven top surface of the bump electrode 300 has a plurality of concave portions and a plurality of convex portions. Each concave portion and convex portion extends along the direction Z in FIG. 15. Each concave portion and convex portion also has an inclined side surface, and does not have a planer surface. The convex portions are not as high as the protrusions 301. The other elements are the same as those of the first and second embodiments.

The bump electrode 300 has the same advantages as in the second embodiment. Further, the uneven surface of the bump electrode improves the adhesion between the inner lead 1 and the conductive material 15. The shape of the uneven surface is not limited to those shown in FIGS. 15(a) and 15(b), and other uneven surface configurations may be utilized to improve adhesion.

The method for manufacturing the semiconductor device of the third embodiment is described below. Most of the steps are the same as those of the other embodiments, except that the insulating layer 105 is not formed under the bump electrode 300. The step as shown in FIG. 5 is not performed in this embodiment. The bump electrode 10, which has a similar structure to the prior art, is formed after the removal of the metal layer 7.

However, a thermo compression is performed to shape the bump electrode 300 after the above steps in this embodiment. FIGS. 16(a) and 16(c) show a tool to shape the bump electrodes. FIG. 16(a) is a top view of the tool, and FIG. 16(b) is a side view of the tool. FIG. 16(c) is an enlarged view of the portion that is shown in circle F of FIG. 16(b). The portion of FIG. 16(c) touches the top surface of the bump electrode 300.

The tool 450 has a plurality of contact portions 451 as shown in FIG. 16(a). The contact portions 451 correspond to the bump electrode 300 respectively. The tool 450 faces the bump electrodes, and is pulled down toward the semiconductor chip 50 as shown in FIG. 16(b). The contact portion 451 touches the bump electrodes 300, and thermo compression is performed. The contact portion 451 has an inclined portion 453 at the edge, and an uneven portion 455 at the center. Therefore, the thermo compression using the tool 450 makes the protrusion 301 and the uneven top surface 302 on the bump electrode 300.

The top surface of the bump electrode 300 is shaped after the formation of the bump electrode 10 of the prior art in this embodiment. The tool 450 for shaping has to be prepared in this embodiment. However, there is no need for forming the insulating layer 105 and forming a hole in the insulating layer 105 like the other embodiments. Therefore, the steps for manufacturing the semiconductor device are decreased. The complication and the cost for manufacturing are decreased. The process for the prior art is available for this embodiment by preparing the tool 450.

The method for manufacturing the semiconductor device of the fourth embodiment is described below. The shape of the bump electrode is the same as the prior art as shown in FIG. 18. The situation that the bonding of the inner lead 1 is performed is different from the prior art in this embodiment. FIG. 17(a) is a top view of the bonding tool 550 of this embodiment. FIG. 17(b) is a side view of the bonding tool 550 of this embodiment. There are partitions between each bump electrode 10 while the bonding is performed as shown in FIG. 17.

The bonding tool 550 has a plurality of grooves 553 at the portion corresponding to the bump electrode 10. Each groove 553 has enough space to cover each bump electrode 10. The bonding tool 550 further has a plurality of partitions 555 between each groove 553.

The bonding tool 550 faces the main surface of the semiconductor chip while the inner lead 1 is electrically connected to the bump electrode 10 via the conductive material 15. A thermo compression is performed by pulling down the bonding tool 550 following the arrow in FIG. 17. Each inner lead 1 and the bump electrode 10 is in each corresponding groove during the thermo compression, and inner leads 1 and the bump electrodes 10 are separated each other. The distance between bump electrodes is at least the same width of the partition 555.

The inner leads 1 are separated each other during the bonding because of the bonding tool 550, which has partitions 555. Therefore, a short-circuit between inner leads or bump electrodes, which are caused by a bending of inner lead or a protrusion of the conductive material 15, is prevented.

The protrusion of the conductive material 15 is not reach adjacent bump electrode because of the partition 555. Therefore, the enough pressure is applied during the thermo compressing. That makes the adhesion between inner lead 1 and the bump electrode 10 improve. The bonding tool 550 has to be prepared in this embodiment. However, There is no need for forming the insulating layer 105, for forming a hole in the insulating layer 105, and for shaping a top surface of the bump electrode like other embodiments. The complication and the cost for manufacturing are decreased.

One skilled in the art will appreciate that the present invention can be practiced by other than the described embodiments, which are presented for purposes of illustration and not limitation. For example, the top surface of the bump electrode 100 of the first embodiment can be shaped using the tool 450 of the third embodiment.

What is claimed is:

1. A method for manufacturing a semiconductor device, comprising:

forming a pad electrode over a main surface of a semiconductor chip; sequentially forming a first insulating layer and a second insulating layer over a peripheral region of said pad electrode, wherein a non-peripheral region of said pad electrode remains exposed;

forming a metal layer over at least portions of said non-peripheral region of said pad electrode and said second insulating layer;

forming a bump electrode on said metal layer, said bump electrode having a top surface with a protrusion along first parallel sides of the too surface and a peripheral portion along second parallel sides of the ton surface, wherein said first parallel sides and said second parallel sides are perpendicular to said second parallel sides, and said protrusion has a greater height than said peripheral portion.

2. A method for manufacturing a semiconductor device, comprising:

forming a bump electrode;

shaping a top surface of the bumping electrode using a shaping tool;

wherein the top surface is shaped to have a plurality of concave and convex portions by pressing the shaping tool to the top of the bump electrode.

3. A method for manufacturing a semiconductor device having bump electrodes, comprising:

positioning a plurality of portions of a tool to form partitions between adjacent bump electrodes, wherein each of the bump electrodes includes a plurality of grooves along a top surface; and connecting a plurality of leads to the bump electrodes, respectively, while the plurality of portions form partitions between respective adjacent bump electrodes.

* * * * *